(12) United States Patent
Stimpson et al.

(10) Patent No.: US 6,496,273 B1
(45) Date of Patent: Dec. 17, 2002

(54) POSITION DETERMINING APPARATUS FOR COORDINATE POSITIONING MACHINE

(75) Inventors: Victor G Stimpson, Avening (GB);
Jonathan P Fuge, Stonehouse (GB);
Benjamin J Merrifield, Newport (GB);
David R McMurtry,
Wotton-under-Edge (GB)

(73) Assignee: Renishaw PLC, Gloucestershire (GB)

( * ) Notice: Subject to any disclaimer, the term of this patent is extended or adjusted under 35 U.S.C. 154(b) by 0 days.

(21) Appl. No.: 09/562,765

(22) Filed: May 2, 2000

(30) Foreign Application Priority Data

May 5, 1999 (GB) .............................................. 9910310
Oct. 15, 1999 (GB) .............................................. 9924333
Nov. 22, 1999 (GB) .............................................. 9927471

(51) Int. Cl.[7] .......................... G01B 11/14; G01B 11/08; G01N 21/86; H01J 40/14
(52) U.S. Cl. ...................... 356/614; 356/621; 356/638; 356/640; 356/124; 356/399; 250/559.14; 250/559.29; 250/550; 250/222.1
(58) Field of Search ................................ 356/614, 621, 356/638, 640, 124, 398, 399; 250/559.14, 559.2, 559.29, 222.1, 550; 408/6, 18; 409/134, 218; 324/766; 414/730

(56) References Cited

U.S. PATENT DOCUMENTS

| 3,749,500 | A | | 7/1973 | Carlson et al. | 356/638 |
|---|---|---|---|---|---|
| 3,900,738 | A | | 8/1975 | McKay, Sr. | 250/559.14 |
| 3,945,730 | A | * | 3/1976 | Simecek et al. | 356/399 |
| 4,423,998 | A | * | 1/1984 | Inaba et al. | 414/730 |
| 4,502,823 | A | | 3/1985 | Wronski et al. | 409/134 |
| 4,518,257 | A | | 5/1985 | Donaldson | 356/621 |
| 4,966,460 | A | | 10/1990 | Kahley | 356/640 |
| 5,024,527 | A | * | 6/1991 | Harrison | 356/124 |
| 5,160,839 | A | * | 11/1992 | Nishiyama et al. | 250/222.1 |
| 5,194,919 | A | * | 3/1993 | Katayama | 356/621 |

FOREIGN PATENT DOCUMENTS

| DE | 3905949 A1 | 8/1990 |
|---|---|---|
| DE | 4238504 | 5/1994 |
| DE | 4244869 | 5/1994 |
| EP | 0 098 930 | 1/1984 |
| EP | 346288 | 12/1989 |
| EP | 0 834 378 A1 | 4/1998 |
| FR | 2343555 | 7/1977 |
| GB | 1040068 | 6/1962 |
| WO | WO 87/07550 | 12/1987 |

OTHER PUBLICATIONS

"Tool Verification Gage", General Electric Company, 1991.
"Laser System for Tool Sizing and Fracture Monitoring" Blum GmbH, 1991.
"Laser gagings allows one–pass precision boring" American Machinist, Oct. 1987, p. 25.

* cited by examiner

Primary Examiner—Loha Ben
(74) Attorney, Agent, or Firm—Oliff & Berridge, PLC (57) ABSTRACT

Described is a device which enables toolsetting on a machine tool. The device includes a light emitting unit (10) and a light detecting unit (14). A light source (30) causes a light beam (12) to propagate from the emitting unit (10) to the detecting unit (14). A light detector (40) detects the presence or absence of the beam. A trigger signal is produced when occlusion occurs and so the position of an object can be determined by reference to the machine's coordinate readings. The beam (12) may be uncollimated and thus provide a device with an easier set-up and a greater resistance to vibration in use. The light detector (40) and/or light source may be protected from contamination by windows (34,44) or a protector having an aperture therein. The light emitting and detecting units each have an aperture for the light beam. The apertures may be oblique conduits (104) for pressurised air flow, thereby keeping the conduits free from contamination, while minimising turbulence in the path of the beam which could cause noise in the resulting signal.

16 Claims, 8 Drawing Sheets

POSITION DETERMINING APPARATUS FOR COORDINATE POSITIONING MACHINE

FIELD OF THE INVENTION

The present invention relates to an apparatus which enables a coordinate positioning machine (such as a machine tool) to determine the position of an object relative to a reference point. It may, for example, be employed on a machine tool for toolsetting operations.

DESCRIPTION OF PRIOR ART

A known tool setting device for use on a machine tool includes a light source which generates a fine beam of light which is incident upon a detector. During a toolsetting operation, the machine is operated to move the tool in a direction transverse to the direction of propagation of the light beam until a part of the tool interrupts passage of the light beam. Detection of this interruption results in the generation of a trigger signal in the detecting unit, which is used by the machine to establish the relative position of its moving parts in order to determine dimensions of the tool. Such devices are known, for example, from German Patent Nos. DE 42 385 04 and DE 42 448 69, French Patent No. 2,343,555, European Patent No. 98,930 and U.S. Pat. No. 4,518,257. The devices may be used additionally for measuring the length or diameter of a tool to monitor tool breakage or wear.

The devices disclosed in the above-mentioned patent specifications use a narrow light beam into or through which the tool is passed. The detection units detect when the tool breaks into the beam from the resulting drop in the intensity of the light falling on them.

The accuracy with which these devices can measure tool position is dependent on the diameter of the laser beam, the smaller the diameter the more accurate the measurement.

For example, French Patent No. 2,343,555 describes a system in which the laser produces a coherent beam the diameter of which is on the order of 0.7 to 0.8 mm. European Patent No. 98,930 proposes the use of a laser light source because lasers supply a sharply defined light beam for high measurement accuracy. U.S. Pat. No. 4,518,257 describes a system in which the laser beam is focused to a small examination zone at which all measurements are made.

One problem with all of these devices is that the smaller the laser beam, the more difficult is the task of aligning the laser beam with the detector system.

Another problem with the prior art systems exemplified in European Patent No. 98,930 is that the optical system has to be kept clean to avoid build up of contaminants on the optical components which can reduce the intensity of light received by the receiver and cause the signal from the detector to be emitted early. This is particularly so in the case of devices which rely on the reduction in intensity produced by the smallest obstruction of the beam to produce a measurement signal.

European Patent No. 98,930 describes two methods of keeping the optical system clean, one of which involves directing an air blast at the external glass faces of the housings of the emitter and receiver, the other of which involves the use of movable mechanical shutter. These methods require the provision of additional cost and complexity to the devices.

A problem with a focused system, as in U.S. Pat. No. 4,518,257, is that the tool can only be measured in the small examination zone. Unfocused systems do not suffer from this problem, but the beam must be accurately aligned with an axis of travel of the machine tool to permit accurate measurements anywhere along the beam path. Prior unfocused systems have been awkward to align, because each time an adjustment is made to the direction of the beam path, the position of the beam must be checked at two different positions along the path, followed by further adjustment as necessary.

One tool setting device known as the Tool Verification Gage (TVG) used by General Electric in the USA has an aperture in a plate at a light transmitter and a similarly apertured plate in a light receiver. The aperture is in the order of 1 mm in diameter. The device operates in the same manner as the devices described previously. It appears that the device is supplied with pressurised air such that the air is caused to exit from the apertures. In this manner the apertures are kept free from contamination and light can pass through the apertures unhindered.

However, in that device the light beam is exposed to air turbulence in the apertures and this causes irregularities at the detector in the form of signal noise. Additionally the aperture allows a high volume of air to escape and so the device is costly to operate. Again lenses are employed to collimate the beam or light from the transmitter and therefore setting up the device is not easy because alignment of the fine beams is required.

SUMMARY OF THE INVENTION

The present invention provides alternative devices which are suitable for toolsetting on a machine tool (or other applications on other coordinate positioning machines). The devices include a number of technical aspects in which they differ from the prior art devices discussed above and which enable various ones of the problems which arise with those prior art devices to be eliminated or reduced.

According to a first aspect of the present invention there is provided a position determination device for a machine utilising coordinate positioning, the device comprising a light emitting unit and a light detecting unit, the light emitting unit having a housing within which a light source is housed for emitting a light beam which in use propagates towards the light detecting unit which in turn includes a housing having a light channel located in register with the light beam, and a light detecting device located substantially in register with the light channel thereby to detect the light beam propagating from the light emitting unit, wherein the light beam is uncollimated such that the size of the resultant spot formed on the detecting unit is substantially larger than the light channel at the light detecting unit.

The light emitting unit may have a light channel also and the or each light channel may be an aperture. Where the light channel is an aperture one or both of the housings may include this aperture in the form of a conduit through which pressurised air supplied to the housings may pass from the interior of the housing to the exterior. In a preferred embodiment of this aspect of the invention the conduit extends transverse or obliquely to the direction of propagation of the light beam between an interior and an exterior aperture of the housing. Also preferably the interior and exterior apertures overlap to the extent that light may pass through the conduit so that the conduit also forms the aperture through which the light beam leaves or enters the respective housing.

Thus the housings of the light emitting and/or detecting units are constructed amongst other things for the purpose of preventing ingress of dirt or contaminants.

The light channels are formed from any light transmissive medium surrounded by a non-transmissive medium, e.g. an aperture or window in a non-transmissive material.

Such a channel has preferably a cross-sectional area of 0.8 mm$^2$ or less. More preferably a channel has at its narrowest point a cross-sectional area in the range of 0.02 mm$^2$ to 0.8 mm$^2$. Where a channel is approximately circular such areas would provide a diameter between 50 microns and 1 mm. Small apertures of this size are often referred to as pinholes.

According to a second aspect of the present invention there is provided a position determination device for a machine utilising coordinate positioning, the device comprising a light emitting unit and a light detecting unit, the light emitting unit having a housing within which a light source is situated for emitting a light beam which in use propagates towards the light detecting unit which in turn includes a housing and a light detecting device to detect the light beam propagating from the light emitting unit, wherein one or both of the housings include a light channel in the form of a conduit through which pressurised air in use supplied to the or each housing may pass from the interior of the housing(s) to the exterior thereof, and the or each conduit extends transversely or obliquely to the general direction of propagation of the light beam.

Preferably the light beam is uncollimated such that the size of the resultant spot formed on the detecting unit is substantially larger than the aperture within the light detecting unit.

A third aspect of the present invention provides a device which enables determination of position of an object on a coordinate positioning machine, including a light emitting unit and a detecting unit, the light emitting unit including a light source and an adjuster for adjusting the angle of a light beam produced by the light source, wherein the adjuster has associated therewith a common centre point, located between the light emitting unit and the detecting unit, that the adjuster directs the light beam through said centre point, and that when the alignment of the beam is adjusted by the adjuster the beam continues to pass through said centre point. This may be achieved by providing the adjuster with a curved bearing surface, preferably a spherical bearing surface, centred on said common point.

In this third aspect of the invention, the alignment of the beam may be simplified since it is no longer necessary to measure the position of the beam repeatedly at two different points along the beam path. Rather, a measurement can be made just once at the common centre point, followed by repeated measurements after each adjustment at another single point along the path. According to a fourth aspect of the present invention a device which enables determination of position of an object on a coordinate positioning machine includes a light emitting unit and a detecting unit, the light emitting unit having a housing within which a light source is situated, the housing having a first light channel through which a beam of light from the light source passes, and which propagates towards the light detecting unit which in turn includes a housing having a second light channel located in register with the light beam, and a light detecting device located substantially in register with the light channels thereby to detect the light beam propagating from the light emitting unit, wherein the light beam is uncollimated and the detecting unit is arranged to emit a trigger signal when the light level it receives has fallen to one half of that which it receives when the beam is not occluded.

BRIEF DESCRIPTION OF THE DRAWINGS

Embodiments of the invention will now be described, by way of example, and with reference to the accompanying drawings, in which.

DESCRIPTION OF PREFERRED EMBODIMENTS

Figure 1:
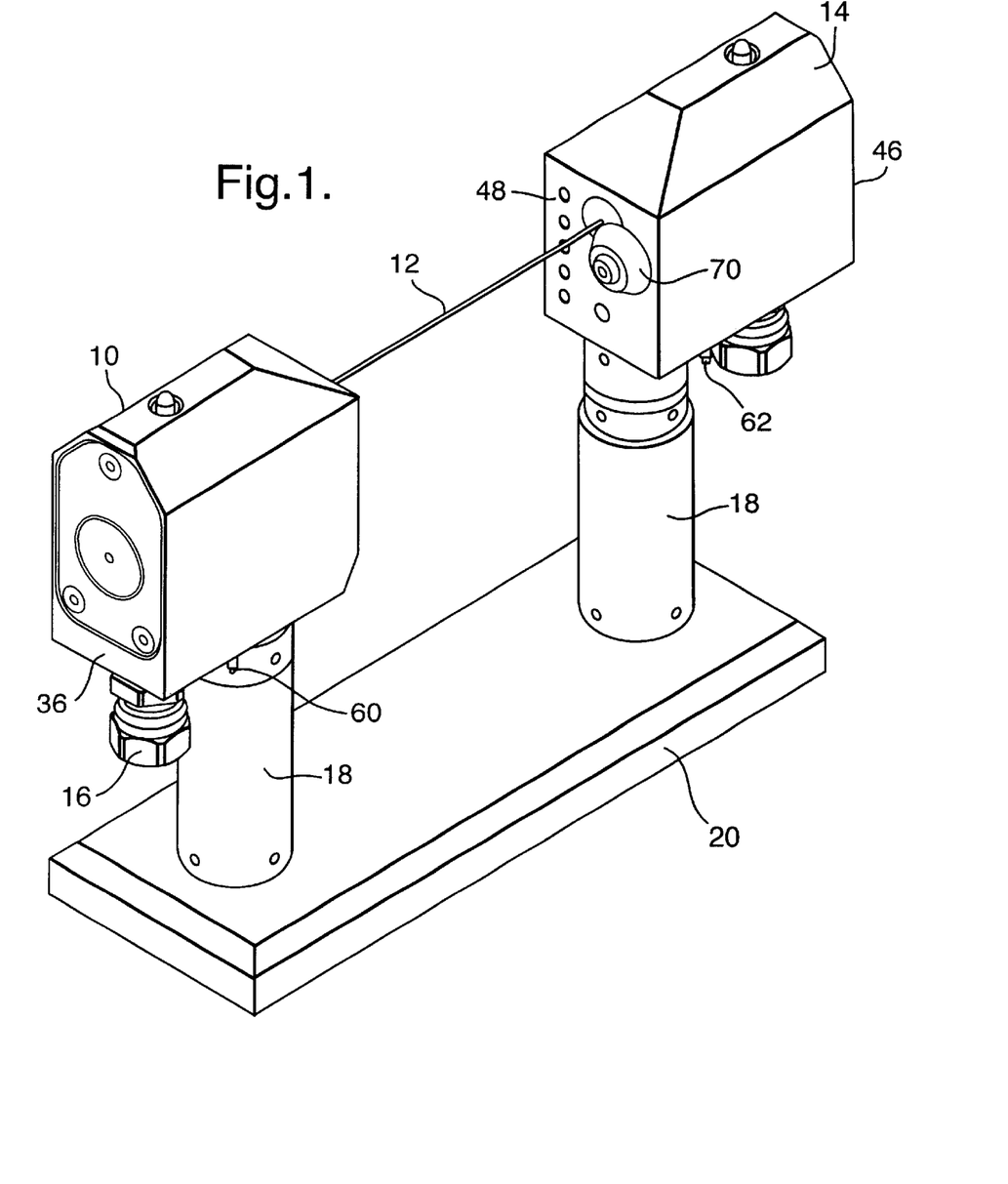
FIG. 1 is a perspective view of a first embodiment of the present invention.

Referring now to FIG. 1, a toolsetting apparatus which is suitable for use on, for example, a machine tool includes a light emitting unit 10 which emits a beam 12 of light, and a light detecting unit 14, where the light beam 12 is detected. Power and signal control cables to the light emitting and detecting units 10,14 are routed via inlet ports 16, and both the units 10,14 are advantageously mounted, via pillars 18, on the base of the machine, either via an intermediate base 20, to which they are both mounted, or directly to the base of the machine upon which they are to be employed.

In operation, the device is used for toolsetting by operating the machine on which the device is mounted to move the tool in a direction transverse to the direction in which the beam 12 is propagating. When a predetermined level of occlusion of the beam has been established, the detecting unit 14 emits a trigger signal which is used by the machine to determine the relative position of its relatively movable parts, thereby to enable dimensions of the tool to be determined. The generation of the trigger signal is described below.

Figure 2:
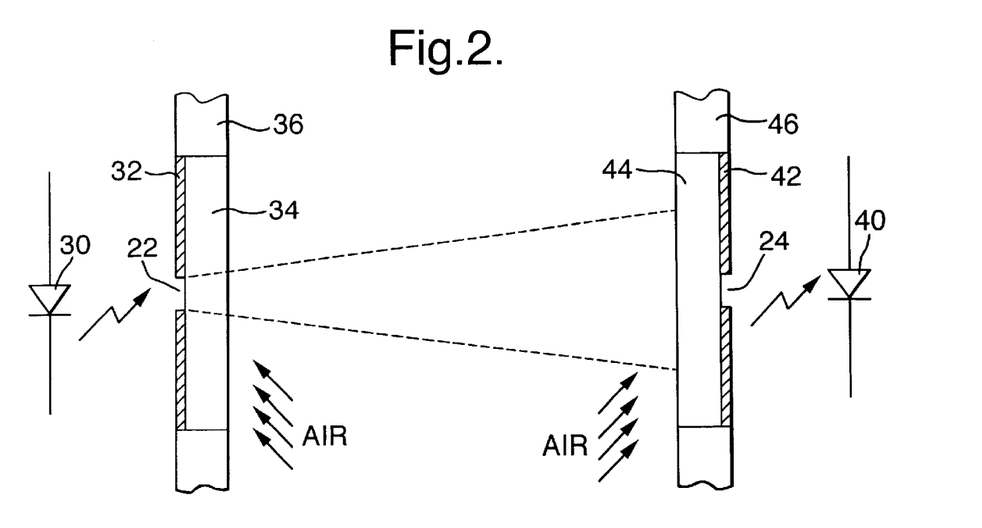
FIG. 2 is a schematic illustration of aspects of the embodiment of FIG. 1.

Referring now additionally to FIG. 2, the light emitting unit 10 comprises a laser diode 30 which generates the beam 12. The beam 12 passes through a light channel, in this case an aperture 22 provided by a screen 32, and subsequently through a translucent or transparent window 34 provided within the housing 36 of the light emitting unit. The beam 12, being laser light, is substantially parallel, but is typically divergent at a small angle, unless collimated. In the present example, the beam is deliberated uncollimated, and allowed to diverge.

The light detecting unit includes a photodetecting diode 40, placed in register with an aperture 24 provided within a screen 42, which is in turn mounted behind a translucent window 44 within the housing 46 of the unit 14. By the time the beam 12 has propagated from the light emitting unit 10, and is incident upon the window 44, the spot created by its incidence is substantially larger than the aperture 22 within the screen 42. Typically, over a distance of one meter between the light emitting unit 10 and the light detecting unit 14, the beam diameter will be of the order of 4 mm at the detecting unit 14, whereas the aperture 24 within the screen 42 might be of the order of 300 microns or less.

The screens 32/42 may be a coating on windows 34/44 e.g. a chromium coating or may be an etched surface on the window.

In order to ensure that both windows 34 and 44 have an outer surface which is free from contaminants, both windows are subjected to an air blast. High-pressure air is supplied to the emitting and detecting units 10,14 via inlet ports 60,62 respectively, and is directed onto the surface of the window via mushroom members 70.

Figure 3:
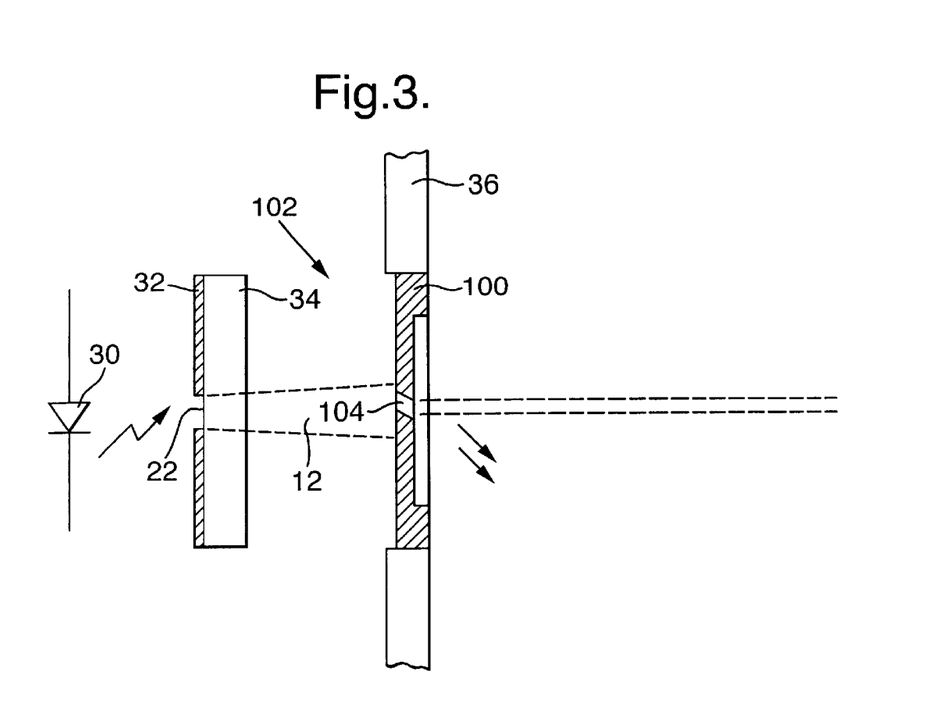
FIG. 3 is a detail of a modification of the embodiment of FIGS. 1–2.
Figure 4A:
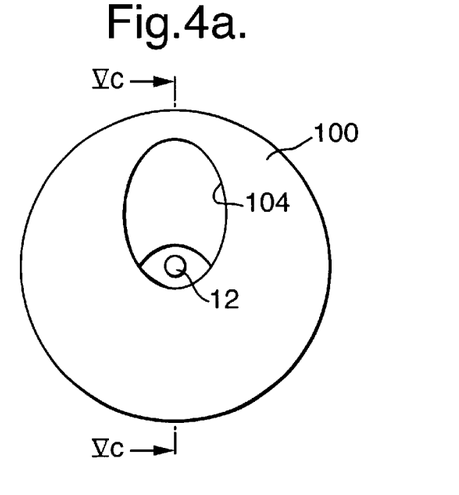
FIGS. 4a–c are details of FIG. 3.
Figure 4B:
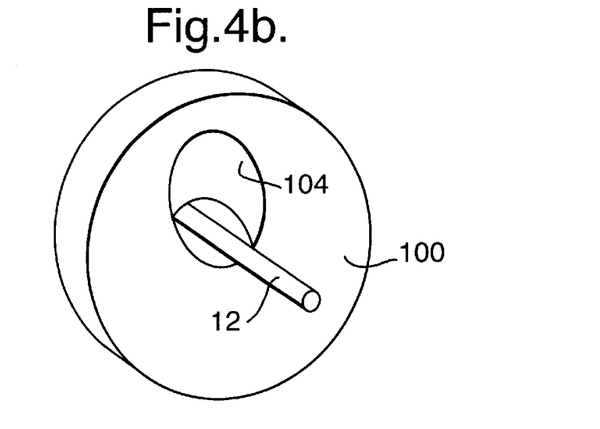
Figure 4C:
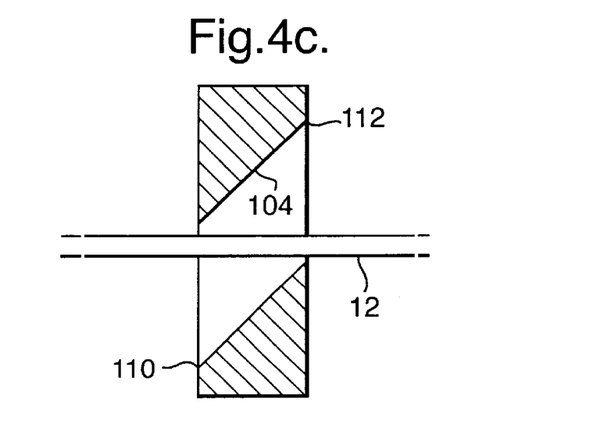

Referring now to FIGS. 3 and 4, in an alternative embodiment, either or both windows 34,44 are positioned behind a further screen 100. Air is supplied to the chamber 102 formed between the windows 34,44 and the screen 100 at pressure e.g. 1.5 bar, and bleeds out of the chamber 102 via a conduit 104 within the screen 100. In this case conduit 104 forms a light channel and is configured such that it extends in a direction transverse or obliquely to the direction of propagation of the beam 12, (e.g. at 10–20° to the general direction of propagation of beam 12) and therefore the resultant air flow has minimal effect upon the beam propagation. (If the conduit were parallel to the beam, then turbulence along the path of the beam could affect the accuracy of measurement.) The beam 12 passes through the conduit 104 by virtue of the inner 110 and outer 112 apertures thereof lying fractionally in register with each other, as can be seen more readily in the front elevation and perspective views of FIGS. 4a and 4b respectively, and the sectional view of FIG. 4c.

The conduit 104 may of course be parallel to the beam 12. A similar conduit 104 may be formed at the detector unit 14 as well as or instead of at the emitter unit 12. Typically this or these conduits are a pinhole extending at 15° to the general direction of propagation of the beam 12 and is/are 1 mm or less in diameter or 0.8 mm$^2$ in cross-sectional area or less. If the pinhole is inclined its effective cross-sectional area will be less, and it will present a non-circular cross-section to light travelling therethrough.

Apertures 22 or 24 may be smaller in diameter than the conduit 104 and may be omitted altogether. FIG. 4 show a fine beam 12 propagating through conduit 104 without touching the sides. In this case aperture 22 will have a smaller diameter than the conduit 104. If an aperture 22/24 is included it will have a cross-sectional area of 0.8 mm$^2$ or less.

The embodiments described previously all employ a light channel which is relatively small in cross-sectional area e.g. 0.8 mm$^2$ or less. The small area allows a fine beam which gives improved position determination accuracy when an object occludes the beam. The use of a divergent beam does not detract from this accuracy provided a light channel of small area is used at, at least the detector.

Accuracy is maintained in such an arrangement because the detector will then only "see" a column of light from the light source and not the remaining divergent beam. As a consequence of this, only this column is detected by the light detector and the remaining divergent light is ignored. Using divergent light has the advantage that the detector does not have to be exactly in line with the emitter. Slight misalignment is possible as is slight vibration. The detector will in these circumstances still see a narrow column of light which can be monitored.

Figure 5:
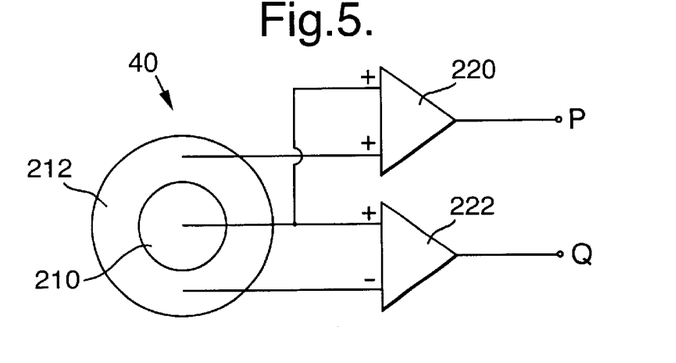
FIG. 5 is a detail of the detecting unit of FIGS. 1 and 2 falling within the ambit of a different aspect of the invention.

Referring now to FIG. 5, the detecting unit 14 has a light detector 200 (equivalent to detector 40 in previous Figures) which comprises a circular photodiode 210 concentrically mounted within an annular photodiode 212, with the photodiodes 210,212 being dimensioned such that their surface area is equal. The photodiodes 210,212 are connected to amplifiers 220,222 which generate outputs P and Q, being the sum and difference respectively of signals generated from the photodiodes 210,212.

Figure 6A:
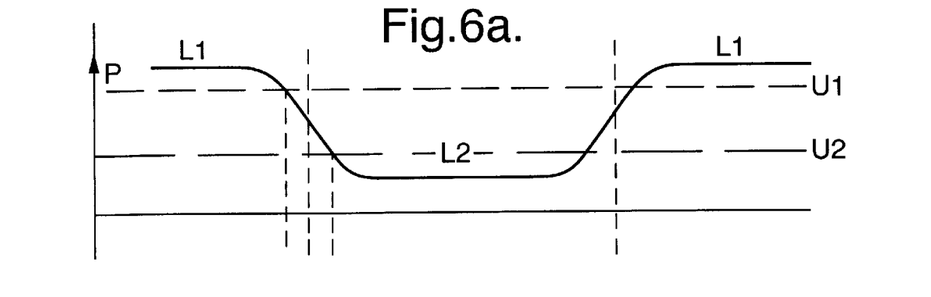
FIGS. 6a and b are signal diagrams illustrating the operation of the detector of FIG. 5.
Figure 6B:
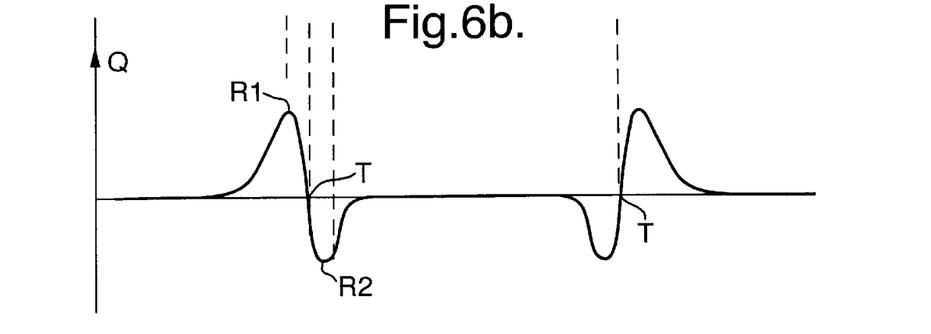

Referring now additionally to FIGS. 6a and 6b, the signal profile of the P (sum) and Q (difference) outputs with time as a tool traverses the light beam 12 are illustrated. It can be seen that the P output has a profile which is initially at a relatively high level L1, corresponding to the signal output when the beam 12 is unoccluded. As the tool begins to traverse the beam path, and thereby occlude the passage of the beam 12 to the photodetector 200, the signal level drops, until the detector 200 is entirely occluded, whereupon the signal drops to level L2. Further passage of the tool will result in the reverse of this process as the tool moves out of the beam path, and the signal level L1 in once again attained.

Referring now especially to FIG. 6b, the Q (i.e. difference) output of the photodiodes is usually approximately zero (subject to noise), because the photosensitive areas of the photodiodes 210,212 are substantially equal, and therefore when the entire photodetector 200 is illuminated the magnitude of the output signals is correspondingly equal. As the passage of the tool through the beam 12 begins to occlude the photodetector 200, the intensity of light incident upon detector 212 starts to reduce in comparison to the amount incident upon detector 210 and thus the Q output starts to rise sharply to a peak value R1. When exactly half of the light beam incident upon the photodetector 200 is occluded by the tool, the Q output will pass through zero, and this point T is the point at which a trigger signal is emitted. Further passage of the tool through the light beam will cause the output to drop to its lower level R2, which corresponds to a condition in which photodiode 210 is entirely occluded but light is still incident on one side of photodiode 212. A similar condition is present as the tool moves out of the light beam, whereupon a further trigger signal T is generated.

To prevent the generation of trigger lights when the output signals from the photodiodes 210,212 are equal, but no variation in the Q output is taking place as a result of a toolsetting operation (i.e. noise fluctuations are causing the Q output repeatedly to pass through the threshold T) the P output is used to latch a trigger circuit (not shown) to be receptive to the generation of a trigger signal only when the P output lies between the signal levels U1 and U2. It can be seen from FIGS. 6a and 6b that the thresholds U1 and U2 on the P output correspond to the maximum and minimum signal levels R1 and R2 on the Q output.

Figure 7:
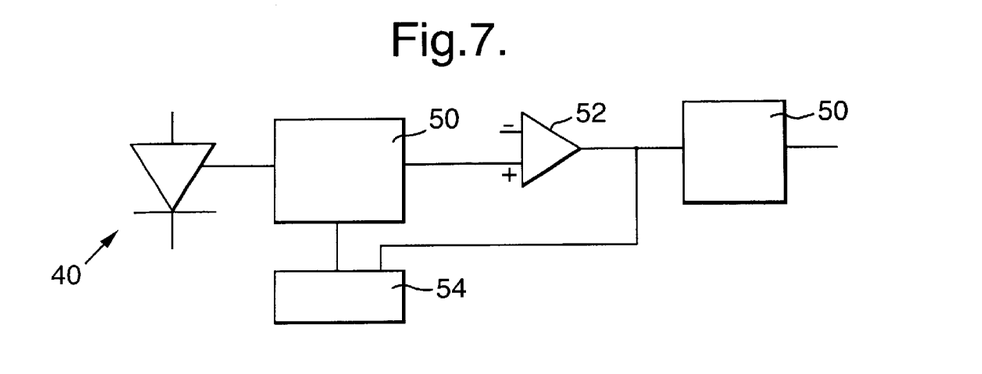
FIG. 7 is a block diagram of part of the electronic circuitry of the detecting unit of FIGS. 1 and 2 falling within the ambit of the different aspect of the invention.

An alternative arrangement for producing a trigger signal when 50% beam occlusion is detected will now be described with reference to FIG. 7. In this arrangement the output of the photodetecting diode 40 is passed to a variable gain amplifier 50 the output of which drives a display of five bar code LEDs 48 (see FIG. 1).

The threshold level of the detector is set by a threshold detector 52 to provide a trigger signal when the intensity of the light falling on it drops to fifty percent of the unobstructed light level. This and the use of the pinhole at the emitter and detector units has the advantage that tool measurements can be taken anywhere along the beam even though the beam expands.

Figure 8:
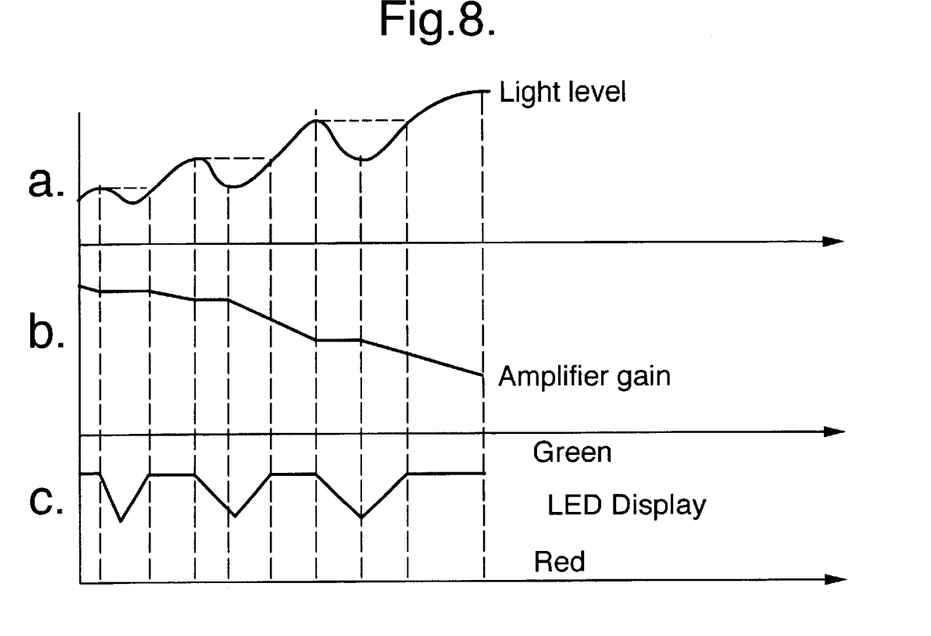
FIGS. 8a, 8b and 8c are graphs showing steps in the set-up procedure.
Figure 9:
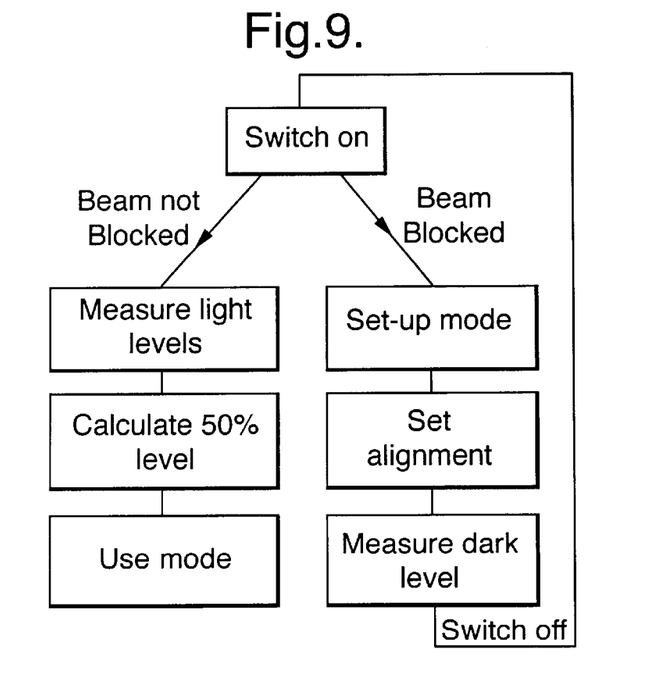
FIG. 9 is a flow diagram illustrating the switch-on routines.

The maximum and threshold intensity levels are obtained during a set-up routine as follows:

When the laser is switched on its output rises to a maximum level at which it is stabilised by a high speed control system. The laser beam is then aligned with the detector unit, and the bar code LED display provides an indication as to when proper alignment is achieved as described below with reference to graphs 8a,8b and 8c.

The bar code LEDs are preferably tri-colour LEDs which are arranged, for example, to register all red at low amplifier output and all green when the amplifier output is maximum.

The gain of the amplifier is set to maximum. As the light falling on the photodiode 40 increases as shown in graph 8a, its amplified output increases linearly, sequentially illuminating the bar code LEDs. When the amplifier voltage exceeds ninety-five percent of its maximum range, and all of the green LEDs are lit, the gain of the amplifier is reduced (see graph 8b). This reduces the number of green LEDs that are illuminated (see graph 8c), and allows the amplifier to receive a greater signal level. As the alignment process continues and all of the green LEDs are lit again, this time at a higher maximum signal, the gain is once again reduced. The process continues reaching higher and higher signal maxima until proper alignment is achieved.

Once the correct alignment has been achieved and thus the maximum light level established, the light level is measured a plurality of times and the measurements averaged to provide a repeatable level. The dark level, i.e. the output of the detector when no laser light is incident upon it is also measured in order to set the fifty percent threshold level required for the trigger signal. Using the fifty percent level as the trigger threshold ensures an accurate and repeatable trigger position regardless of the direction from which the tool enters the beam.

Figure 10:
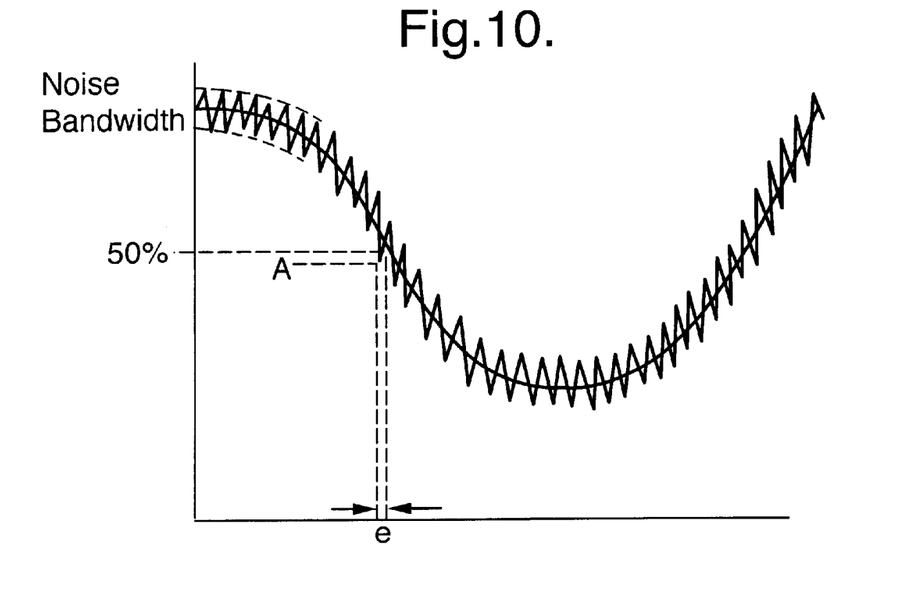
FIG. 10 is an illustration of the noise on the output of the detector.

Because the accuracy of the trigger signal depends on the accuracy with which the fifty percent light level is measured, if the beam is blocked when the device is switched on, it automatically defaults into set up mode. Otherwise, if the beam is not blocked when the device is switched on, the routine for measuring the maximum light levels and the dark level is enabled so that an accurate 50% level is established each time the device is switched on. FIG. 10 illustrates this routine.

If desired, the maximum light level and the dark level can be updated at intervals so that the fifty percent trigger level can be continuously updated.

Although the laser is driven at a constant light level, the intensity of light reaching the detector is variable for a variety of reasons, for example, relative movement between the screen 42 and the detector 40, atmospheric variations, or laser mode hopping. Thus the amplifier is provided with automatic gain control 54 to ensure that the resulting output provides the maximum signal to noise ratio.

It is also possible that the intensity of the light beam varies across its width and a further advantage of using pinholes is that any variation in the intensity of light falling on the detector due to this cause is confined to the variation across the centre of the beam.

Further refinements may be added to the electronics. For example coolant droplets could cause reductions of intensity in addition to that produced by obscuration of the beam due to the tool, and thus and give a false trigger signal. Since signal spikes due to this cause are of short duration, the electronic circuit may include a timer which is re-set at the leading edge of each signal and if the signal is still there after a pre-set interval, for example, 5 milliseconds, it is assumed to be a genuine signal.

Also noise on the output of the photodiode could give rise to early triggering as the tool enters the beam as explained below.

Referring to FIG. 10 it can be seen that if a noise spike reduces the apparent intensity adjacent the threshold level by an amount A, this gives rise to an error (e) in trigger position. Errors due to this cause can be eliminated if the noise intensity bandwidth is monitored, and a value of half of the bandwidth is applied to output signal to lower the threshold level. A similar problem arises if the increasing intensity as the tool leaves the beam is used to obtain a second trigger signal, and a similar solution is applied to avoid this error. Further, since the LEDs of the bar graph array consume significant power, and thus heat up the detector array and cause errors, the electronic circuit may include a timer 56 which is arranged to pulse the power to the LEDs at a pre-selected mark-space ratio, so that they are switched on and off sufficiently rapidly to give good visibility with no flicker whilst ensuring that they are switched off for a significant part of the time.

Finally a high speed tool breakage detection system has been included.

When a tool is being replaced in its tool holder it is passed through the beam. The machine controller often does not have the ability to constantly monitor all of the inputs it receives. The electronic circuit of the tool setter therefore includes a latch mode which is selected for tool breakage monitoring. In this mode the trigger signal produced by the tool breaking the beam is latched so that the signal can be detected during the next monitoring cycle performed by the controller.

Figure 11:
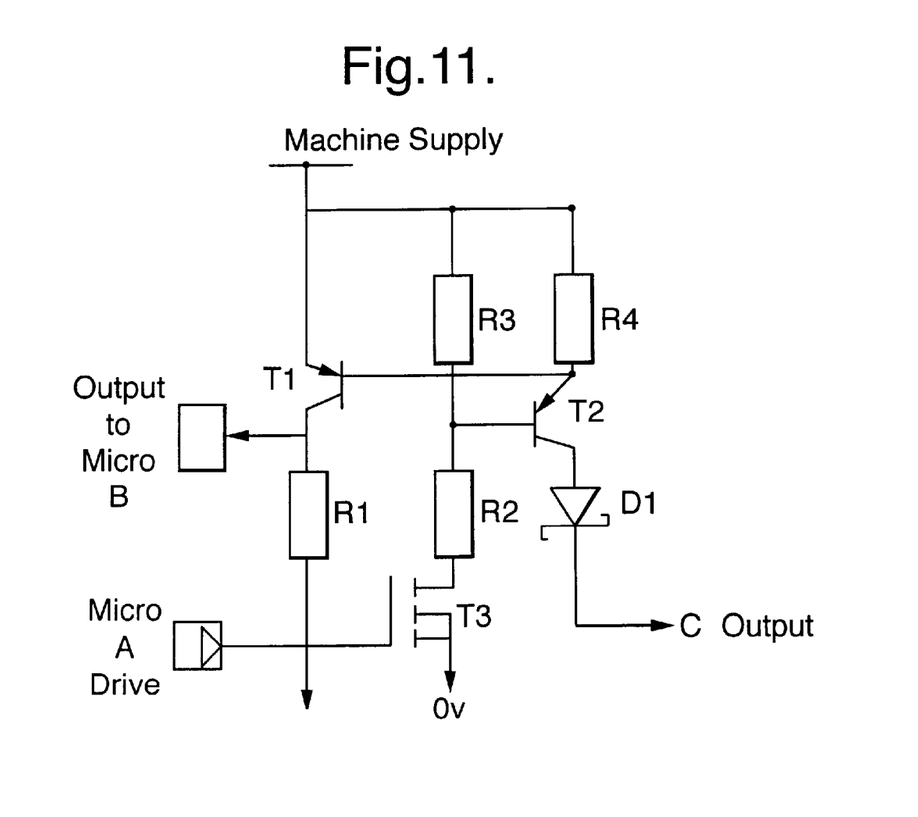
FIG. 11 is a circuit diagram for a refinement of the invention.

In a further novel refinement an electronic fuse is incorporated which provides protection for the interface against the outputs being wired up incorrectly, or any other cause of excessive current passing through the device. This is illustrated in FIG. 11 to which reference is now directed.

The device is controlled by two microprocessors A and B.

When there is no signal generated from the device, microprocessor A received 0 (zero) volts, so that transistor T3 remains off and no current flows through resistors R2 and R3. Because of this, transistor T2 does not switch on and output C remains low.

When a voltage for example more than 2 volts is applied to A, transistor T3 switched on. Thus current flows through resistors R2 and R3, supplying current to transistor T2 which switches on and allows current to flow through resistor R4 and the Zener diode D1 so that the output C goes high.

The sensor circuit comprises transistor T1 and the microprocessor B. In the normal current state, for example, the voltage across R4 due to the current flow is less than 0.6 volts, transistor T1 does not switch on, no current flows through resistor R1 and the output to microprocessor B is low.

When excessive current is produced in the circuit for any reason, so that the voltage across resistor R4 is greater than 0.6 volts, transistor T1 switches on, current flows through resistor R1 and the output to microprocessor B goes high.

This output is monitored by the microprocessor, which can be programmed to operate immediately and reduce the output of microprocessor A to a low value, giving a fast response fuse. Alternatively the microprocessor B can be programmed to provide a delay to accommodate quick current surges which are not critical.

This type of fuse can be used, for example, to give a time delay characteristic during start up when current surges in the component are to be expected but to switch to fast blow when the circuit is stabilised.

As an alternative to using microprocessors, a mono-stable or a set/re-set latch.

Next, the embodiment according to FIGS. 12–14 will be described.

Figure 12:
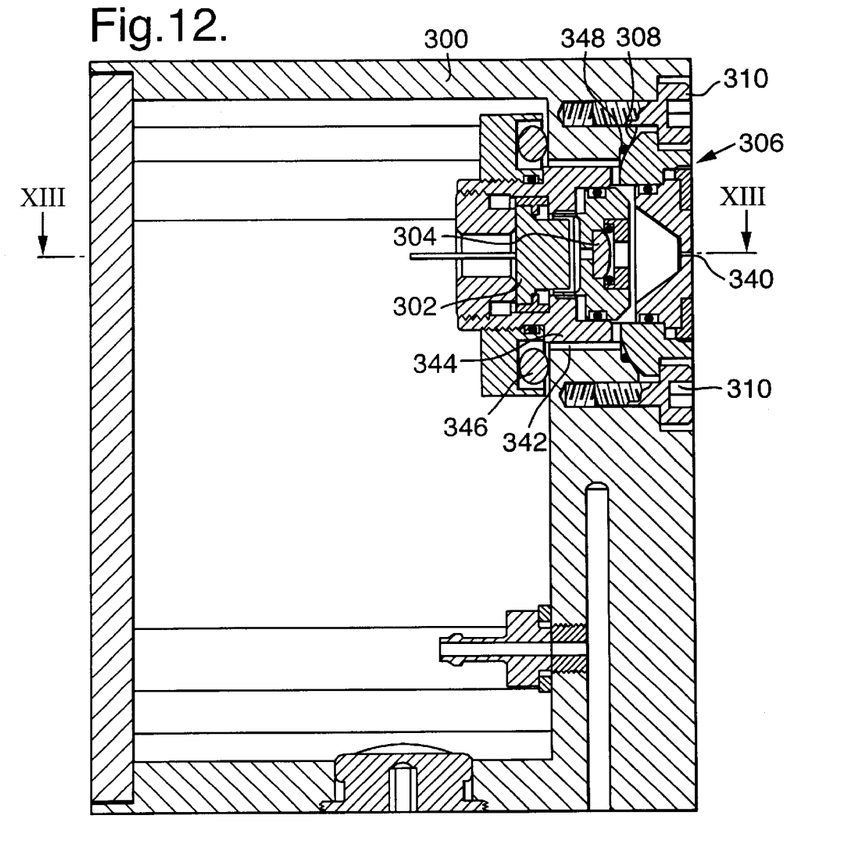
FIG. 12 is a vertical section of a light emitting unit of another aspect of the present invention.
Figure 13:
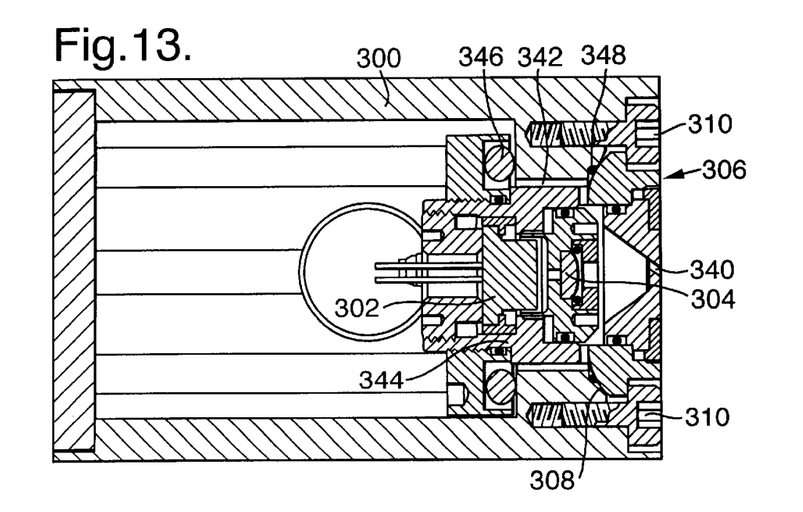
FIG. 13 is a section on the line XIII—XIII in FIG. 12.

The light emitting unit shown in FIGS. 12 and 13 comprises a housing 300, containing a laser diode 302 and a collimating lens 304. Thus, this embodiment uses a collimated beam of light, rather than a diverging beam. However, the beam is not focused, and therefore (once the beam has been aligned with the axes of the machine tool) toolsetting measurements are possible anywhere along the length of the beam. As previously, the diameter of the beam is about 1 mm or less. Consequently, there is no need for relatively large apertures to allow the beam to pass from the light emitting unit or into the light detecting unit.

The laser diode 302 and lens 304 are mounted together in an adjustment unit 306. This is adjustably fastened to the housing 300, through a spherical bearing face 308.

This is shown in the present embodiment as being a surface of the adjustment unit 306, but could equally be a surface of the housing 300 which mates with the adjustment unit.

The adjustment unit 306 has adjusting screws 310. Using these, the optical axis along which the laser diode 302 and lens 304 project the laser beam may be adjusted through a small angle, both vertically and horizontally.

Figure 14:
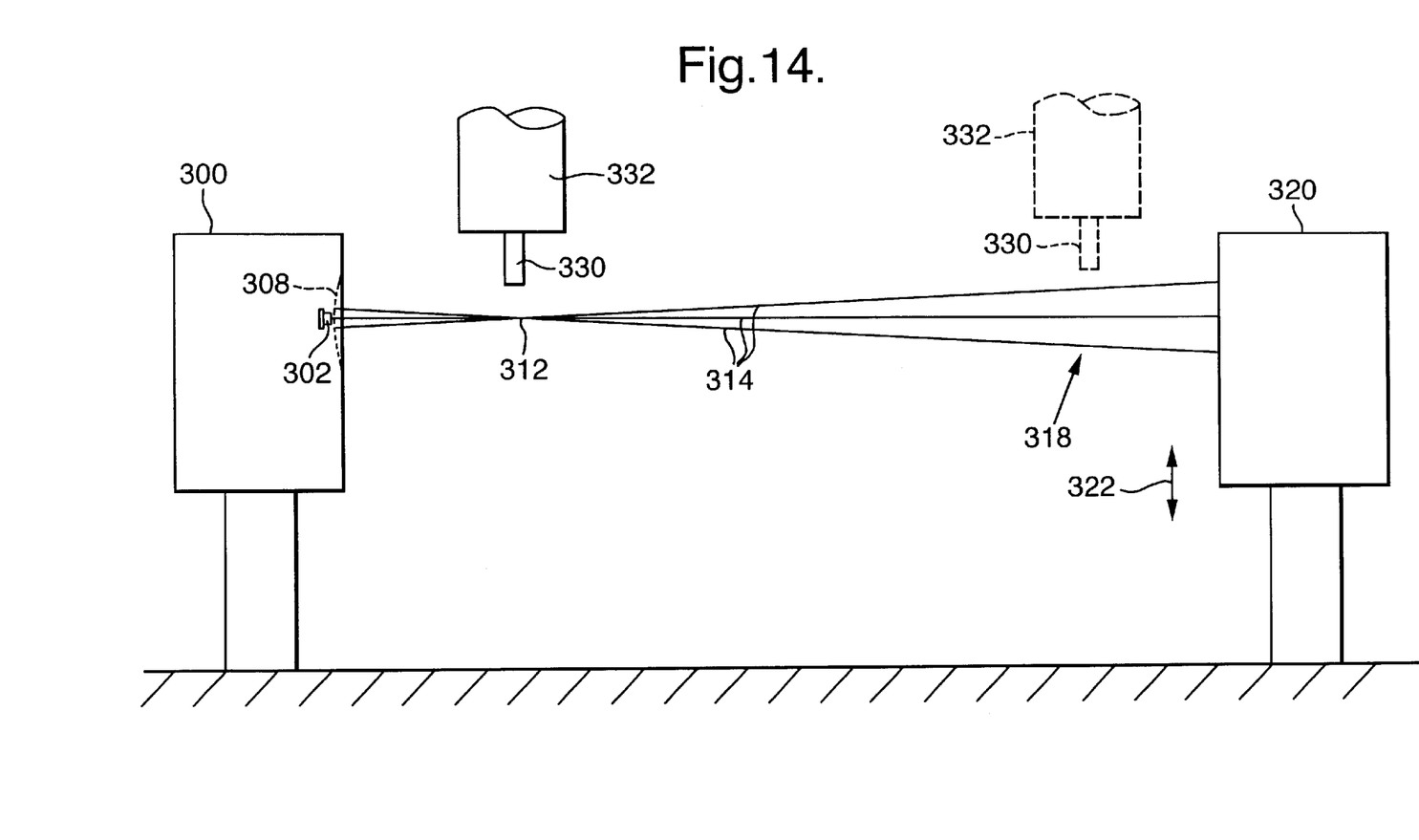
FIG. 14 is a schematic illustration of a method of beam alignment using the other aspect shown in FIGS. 12 and 13.

The effect of this adjustment can be seen in FIG. 14. This figure shows the light emitting unit 300 and also the light detecting unit 320. It can be seen that the spherical bearing surface 308 is centred at a point 312, located along the path of the laser beam between the light emitting unit 300 and the detecting unit 320. FIG. 14 shows three possible beam paths 314, for three possible adjustment positions of the adjustment unit 306, and all these possible paths pass through the point 312.

Still referring to FIG. 14, the toolsetting device is adjusted as follows. With the laser diode 302 emitting light, the detecting unit 320 is first adjusted both vertically (arrows 322) and horizontally so as to receive the laser beam. Next, the beam is probed at the point 312 by a tool or other object 330 mounted in the machine tool spindle 332. The vertical and horizontal positions of the beam are noted at this point 312.

For accurate toolsetting, it is necessary that the laser beam should be aligned with one of the axes of travel of the machine tool. To ensure this, the alignment of the beam must be adjusted so that, at a further position 318, it is located at the same vertical and horizontal coordinates as at the position 312. Therefore, the tool 330 is moved by the spindle 332 to the location 318, as indicated in broken lines, and the beam is again probed at this location 318.

It is of course unlikely that the beam will have initially been corrected aligned, and consequently the horizontal and vertical coordinates of the beam at the location 318 will not agree with those taken at the point 312. The adjustment unit 306 is therefore adjusted, using the screws 310, to realign the beam. Because the bearing surface 308 is centred on the point 312, it is assured that the beam will continue to pass through the point 312. Therefore, as the beam is adjusted, it is only necessary to re-probe it at the location 318, making further adjustments as necessary to align the beam with the machine axis. During these adjustments, of course, the detector unit 320 will be repositioned as necessary in order to capture the beam.

The method of adjustment just described is considerably simpler as a result of the spherical bearing surface 308. This is because it is necessary to re-probe the laser beam only at the location 318 after each adjustment, and not to re-probe it at the location 312 after each adjustment step. However, it is of course possible if desired to re-probe at the position 312, as a final check after all the adjustment has been performed.

It can be seen from FIGS. 12 and 13 that the adjustment unit 306 includes an exit conduit 340 for the laser beam. This is supplied with pressurised air, as previously. Also as previously, the conduit 340 is directed transversely or obliquely to the laser beam, so that the flow of air causes minimum disturbance to the beam as it propagates towards the detector unit 320.

The pressurised air to the conduit 340 is supplied through passages in the front wall of the housing 300, passing through an annular space 342 between the adjustment unit 306 and the housing 300. As it does so, it is in contact with a body part 344 of the adjustment unit 306, which is in thermal contact with the laser diode 302. This body part is made of a thermally conductive material such as aluminium, and acts as a heat sink. The result is that the pressurised air passing through the annular space 342 cools the laser diode. The adjustment unit 306 is provided with appropriate O-rings to seal the pressurised air, including an O-ring 346, and an O-ring 348. The O-ring 348 seals between the housing 300 and the spherical bearing surface 308. The O-ring 346 provides sufficient flexibility to permit the tilting of the adjustment unit 306 horizontally and vertically, while maintaining the seal.

As in previous embodiments, the conduit 340 need only be small, since the laser beam is unfocused and is itself collimated to a small diameter. The air consumption is therefore low. Since the pressurised air ensures that the conduit remains clean, a shutter over the conduit may not be needed, though one can be provided if desired.

Of course, both in the embodiments of FIG. 4 and of FIGS. 12–14, it is possible to provide a transverse of oblique conduit leading to the photodetector in the detecting unit, and to keep it clean with pressurised air, in the same way as in the light emitting unit.

The present invention has been described and illustrated using a laser diode as a light source from which the light beam 12 is created. However, other forms of electromagnetic radiation may be employed, and any light source may be used to create the beam 12 with the proviso that a sufficiently high luminosity may be obtained from the beam at the detecting unit 14.

What is claimed is:

1. A position determination device for a machine utilising coordinate positioning, the device comprising a light emitting unit and a light detecting unit; the light emitting unit having a housing, and a light source within the housing for emitting a light beam which in use propagates towards the light detecting unit; the light detecting unit including a housing having a light channel located in register with the light beam, and a light detecting device located substantially in register with the light channel thereby to detect the light beam propagating from the light emitting unit; wherein the light beam is uncollimated such that the size of the resultant spot formed on the detecting unit is substantially larger than the light channel at the light detecting unit.

2. A position determination device as claimed in claim 1 wherein the light channel is formed as an aperture.

3. A position determination device as claimed in claim 2, including a supply of pressurised air to the housing of the light detecting unit, wherein said aperture is in the form of a conduit through which the pressurised air may pass from the interior of the housing to the exterior thereof.

4. A position determination device as claimed in claim 3 wherein the conduit extends transversely or obliquely to the general direction of propagation of the light beam.

5. A position determination device as claimed in claim 1 wherein the housing of the light emitting unit also has a light channel.

6. A position determination device as claimed in claim 5 wherein the light channel of the light emitting unit is formed as an aperture.

7. A position determination device as claimed in claim 6, including a supply of pressurised air to the housing of the light emitting unit, wherein said aperture is in the form of a conduit through which the pressurised air may pass from the interior of the housing to the exterior thereof.

8. A position determination device as claimed in claim 7 wherein the conduit extends transversely or obliquely to the general direction of propagation of the light beam.

9. A position determination device as claimed in claim 1 wherein the light channel has a cross-sectional area of 0.8 mm$^2$ or less.

10. A position determination device for a machine utilising coordinate positioning, the device comprising a light emitting unit and a light detecting unit; the light emitting unit having a housing, and a light source within the housing for emitting a light beam which in use propagates towards the light detecting unit; the light detecting unit including a housing and a light detecting device to detect the light beam propagating from the light emitting unit; wherein at least one of the housings includes a supply of pressurised air and an aperture through which the light beam passes, the aperture being in the form of a conduit through which the pressurised air in use may pass from the interior of the housing to the exterior thereof; and wherein the conduit extends transversely or obliquely to the general direction of propagation of the light beam.

11. A position determination device as claimed in claim 10, wherein the housing of the light detecting unit has said supply of pressurised air and said aperture.

12. A position determination device as claimed in claim 11 wherein the light beam is uncollimated such that the size of the resultant spot formed on the detecting unit is substantially larger than the aperture of the light detecting unit.

13. A position determination device as claimed in claim 10, wherein the housing of the light emitting unit has said supply of pressurised air and said aperture.

14. A position determination device which enables determination of position of an object on a coordinate positioning machine, including a light emitting unit and a detecting unit, the light emitting unit including a light source and an adjuster for adjusting the angle of a light beam produced by the light source; wherein the adjuster has associated therewith a common centre point, located between the light emitting unit and the detecting unit; wherein the adjuster directs the light beam through said centre point; and wherein, when the alignment of the beam is adjusted by the adjuster, the beam continues to pass through said centre point.

15. A position determination device as claimed in claim 14 wherein the adjuster is provided with a curved bearing surface.

16. A position determination device as claimed in claim 15 wherein the curved bearing surface is spherical and has a point of origin centred on said common centre point.

* * * * *